United States Patent
Wang et al.

(10) Patent No.: US 9,500,700 B1
(45) Date of Patent: Nov. 22, 2016

(54) CIRCUITS FOR AND METHODS OF TESTING THE OPERATION OF AN INPUT/OUTPUT PORT

(71) Applicant: Xilinx, Inc., San Jose, CA (US)

(72) Inventors: Xiaobao Wang, Cupertino, CA (US); Burton M. Leary, San Jose, CA (US); Amitava Majumdar, San Jose, CA (US); Arvind R. Bomdica, Palo Alto, CA (US)

(73) Assignee: XILINX, INC., San Jose, CA (US)

( * ) Notice: Subject to any disclaimer, the term of this patent is extended or adjusted under 35 U.S.C. 154(b) by 335 days.

(21) Appl. No.: 14/081,461

(22) Filed: Nov. 15, 2013

(51) Int. Cl.
*G01R 31/02* (2006.01)
*G01R 31/28* (2006.01)

(52) U.S. Cl.
CPC ................................. *G01R 31/2851* (2013.01)

(58) Field of Classification Search
CPC .................. G01R 31/2851; G01R 31/318572; G01R 31/04; G01R 31/31717; G01R 31/2853; G01R 31/043; G01R 31/045; G01R 27/28
USPC ....... 324/762.01–762.03; 361/679.4, 679.45, 361/686
See application file for complete search history.

(56) References Cited

U.S. PATENT DOCUMENTS

| | | | | |
|---|---|---|---|---|
| 4,527,115 A * | 7/1985 | Mehrotra | ....... | G01R 31/318516 324/73.1 |
| 4,691,161 A * | 9/1987 | Kant | ............. | G01R 31/318516 326/125 |
| 4,703,484 A * | 10/1987 | Rolfe | ............. | G01R 31/318572 714/726 |
| 4,970,410 A * | 11/1990 | Matsushita | .... | G01R 31/318522 326/47 |
| 5,146,161 A * | 9/1992 | Kiser | ............... | G01R 31/31924 324/762.02 |
| 5,369,646 A * | 11/1994 | Shikatani | ....... | G01R 31/318516 714/733 |
| 5,390,191 A * | 2/1995 | Shiono | ........... | G01R 31/318558 714/727 |
| 5,457,381 A * | 10/1995 | Farwell | ............ | G01R 31/31715 324/750.3 |
| 5,594,694 A * | 1/1997 | Roohparvar | ........... | G11C 16/26 365/185.21 |
| 5,661,690 A * | 8/1997 | Roohparvar | ........... | G11C 29/02 365/185.2 |

(Continued)

*Primary Examiner* — Jermele M Hollington
*Assistant Examiner* — Sean Curtis
(74) *Attorney, Agent, or Firm* — John J. King; Steven Roberts

(57) ABSTRACT

An integrated circuit enabling the communication of data is described. The integrated circuit comprises an input/output port; a plurality of data converter circuits; and programmable interconnect circuits coupled between the input/output port and the plurality of data converter circuits, the programmable interconnect circuits enabling a connection of the plurality of data converter circuits to the input/output port of the integrated circuit. A method of enabling the communication of data in an integrated circuit is also described.

19 Claims, 9 Drawing Sheets

(56) References Cited

U.S. PATENT DOCUMENTS

| | | | | |
|---|---|---|---|---|
| 5,734,661 A * | 3/1998 | Roberts | G11C 29/48 | 714/733 |
| 5,786,703 A * | 7/1998 | Piirainen | G01R 31/318555 | 324/750.3 |
| 5,815,511 A * | 9/1998 | Yamamoto | G01R 31/31701 | 714/43 |
| 5,828,827 A * | 10/1998 | Mateja | G01R 31/318541 | 714/30 |
| 5,936,448 A * | 8/1999 | Ohie | G01R 31/31715 | 327/205 |
| 6,180,426 B1* | 1/2001 | Lin | G01R 31/31905 | 257/E21.705 |
| 6,275,428 B1* | 8/2001 | Fukuda | G11C 29/14 | 365/201 |
| 6,303,996 B2* | 10/2001 | Lin | | 257/777 |
| RE37,500 E * | 1/2002 | Lee | G01R 31/318536 | 324/73.1 |
| 6,356,095 B1* | 3/2002 | Komoriya | G01R 31/318505 | 324/750.3 |
| 6,397,361 B1* | 5/2002 | Saitoh | G11C 29/48 | 324/73.1 |
| 6,469,396 B1* | 10/2002 | Kawai | H01L 22/32 | 257/203 |
| 6,548,910 B2* | 4/2003 | Kawai | H01L 22/32 | 257/207 |
| 6,560,734 B1* | 5/2003 | Whetsel | G01R 31/318583 | 714/724 |
| 6,586,266 B1* | 7/2003 | Lin | G01R 31/2884 | 257/E21.705 |
| 6,643,810 B2* | 11/2003 | Whetsel | G01R 31/318583 | 714/724 |
| 6,721,913 B1* | 4/2004 | Azimi | G01R 31/3172 | 324/73.1 |
| 6,771,087 B1* | 8/2004 | Oz | G01R 31/31713 | 324/762.02 |
| 6,807,505 B2* | 10/2004 | De Jong | G11C 29/32 | 324/500 |
| 6,832,348 B2* | 12/2004 | Kawabe | G01R 31/318522 | 714/733 |
| 6,888,414 B2* | 5/2005 | Albean | G01R 31/3016 | 331/108 C |
| 6,944,810 B2* | 9/2005 | Oberle | G01R 31/31715 | 714/724 |
| 7,013,415 B1* | 3/2006 | Kamei | G01R 31/318558 | 714/729 |
| 7,124,340 B2* | 10/2006 | Bos | G01R 31/318544 | 714/729 |
| 7,134,059 B2* | 11/2006 | Jeon | G11C 7/1012 | 714/718 |
| 7,190,593 B2* | 3/2007 | Aiki | G01R 31/2884 | 361/760 |
| 7,272,764 B2* | 9/2007 | Rich | G01R 31/318555 | 714/729 |
| 7,352,169 B2* | 4/2008 | Abraham | G01R 31/318572 | 324/762.02 |
| 7,378,735 B2* | 5/2008 | Lin | G01R 31/2884 | 257/738 |
| 7,409,614 B2* | 8/2008 | Rich | G01R 31/318555 | 714/732 |
| 7,461,310 B2* | 12/2008 | Wang | G01R 31/31858 | 714/727 |
| 7,484,188 B2* | 1/2009 | Duan | G01R 31/31723 | 716/136 |
| 7,535,102 B2* | 5/2009 | Lin | G01R 31/2884 | 257/738 |
| 7,590,902 B1* | 9/2009 | Tabatabaei | G01R 31/318572 | 714/724 |
| 7,609,079 B2* | 10/2009 | Von Staudt | G01R 31/2884 | 324/750.3 |
| 7,640,474 B2* | 12/2009 | Seibold | G06F 11/267 | 714/727 |
| 7,663,163 B2* | 2/2010 | Ojiro | H01L 22/32 | 257/203 |
| 7,750,656 B2* | 7/2010 | Del Gatto | G01R 31/31723 | 324/750.3 |
| 7,814,386 B2* | 10/2010 | Seibold | G01R 31/318544 | 714/727 |
| 7,868,454 B2* | 1/2011 | Lin | G01R 31/31905 | 257/738 |
| 7,868,463 B2* | 1/2011 | Lin | G01R 31/31905 | 257/777 |
| 7,888,965 B2* | 2/2011 | Street | H03K 19/1733 | 326/37 |
| 7,923,848 B2* | 4/2011 | Lin | G01R 31/31905 | 257/777 |
| 7,932,735 B2* | 4/2011 | Von Staudt | G01R 31/2884 | 324/750.3 |
| 7,941,781 B1* | 5/2011 | Duan | G01R 31/31723 | 716/136 |
| 7,999,381 B2* | 8/2011 | Lin | G01R 31/2884 | 257/738 |
| 8,164,966 B2* | 4/2012 | Stratz | G01R 31/31727 | 331/44 |
| 8,386,980 B2* | 2/2013 | Murray | G06F 17/505 | 716/119 |
| 8,399,988 B2* | 3/2013 | Lin | G01R 31/31905 | 257/738 |
| 8,548,071 B2* | 10/2013 | Collins | H03K 19/17744 | 326/8 |
| 9,140,751 B2* | 9/2015 | Ong | G01R 31/31715 | |
| 9,214,941 B2* | 12/2015 | Sewani | H03K 19/018521 | |
| 2005/0108603 A1* | 5/2005 | Spirkl | G01R 31/31716 | 714/724 |
| 2008/0130388 A1* | 6/2008 | Mimoto | G11C 29/12 | 365/201 |
| 2011/0171906 A1* | 7/2011 | Canegallo | H03K 19/0175 | 455/41.1 |
| 2011/0179325 A1* | 7/2011 | Gupta | G01R 31/318547 | 714/727 |
| 2012/0017118 A1* | 1/2012 | Barakat | G06F 11/221 | 714/37 |
| 2012/0324302 A1* | 12/2012 | Arslan | G01R 31/318572 | 714/727 |
| 2015/0346274 A1* | 12/2015 | Gorman | G01R 31/2856 | 324/762.03 |

* cited by examiner

CIRCUITS FOR AND METHODS OF TESTING THE OPERATION OF AN INPUT/OUTPUT PORT

TECHNICAL FIELD

The various circuits relate generally to integrated circuit devices, and in particular to circuits for and methods of testing the operation of an input/output port.

BACKGROUND

Data transmission is an important part of many integrated circuits and systems having integrated circuits. Data is typically communicated with an integrated circuit by way on an input/output (I/O) port. Data may be communicated in a system in different formats and according to a variety data communication protocols. However, the input/output circuits can significantly affect the performance of an integrated circuit device. Accordingly, I/O ports are often monitored to determine performance characteristics of the I/O port, and therefore the integrated circuit device and possibly a system implementing the integrated circuit device.

Conventional integrated circuits implement process monitor vehicle (PMV) circuits to monitor input/output (I/O) transistor process corners. However, the PMV circuits are not true representation of I/O circuits because of their structure, causing difficulties of correlation between the PMV results and I/O performance. Also, I/O performance tests and product tests usually involve fabric circuits, making it hard to isolate and characterize the true IO performance. In some cases, the delay contribution from FPGA fabric for example can be significant. For example, the delay can be up to 50%. In conventional devices, a typical configuration for I/O performance characterization applies an input signal to an I/O pad, through a Rx buffer and input multiplexer, and then to the fabric. The signal is then routed back from fabric to a transmitter through an output multiplexer to another I/O pad to be observed. In this configuration, circuits from both IO and fabric impact the signal, making it hard to isolate the contributions of delay, jitter and duty cycle distortion of the fabric from I/O circuit.

SUMMARY

A circuit for testing the operation of an input/output port of an integrated circuit device is described. The circuit comprises a first input/output port having a first input/output pad for receiving a test signal; a second input/output port having a second input/output pad; and a selection circuit for routing the test signal received by way of a test signal output to the second input/output pad.

Another circuit for testing the operation of an input/output port of an integrated circuit device comprises a plurality of input/output ports, each input/output port having a test signal input, a test signal output, and a selection circuit, wherein the selection circuit of each input/output port enables coupling a test signal to the test signal input of another input/output port by way of the test signal output; and a control circuit coupled to control the plurality of input/output ports to operate in a test mode or an operational mode.

A method of testing the operation of an input/output port of an integrated circuit device is also described. The method comprises configuring a first input/output port to operate in a test mode; receiving a test signal from a second input/output port at a test signal input of the first input/output port; and routing the test signal to a first input/output pad of the first input/output port by way of the test signal input.

DETAILED DESCRIPTION

The various circuits and methods set forth below relate to circuits for and methods of testing the operation of an input/output port. At least one input/output port enables receiving a test signal from another input/output port by way of circuits associated with the input/output ports. Because the input/output ports include the circuits necessary to loop an input signal back from one input/output port to another input/output port, the performance of the input/output port, such as the speed of the transistors of the input/output ports, can be more accurately determined.

By providing a loop back circuit to route the input signal received at a first input/output port back to another input/output port, the circuit can advantageously test the input/output port receiver and transmitter performance by direct internal loopback between receiver and transmitter without using fabric of the integrated circuit. The test/characterization results represent the input/output performance more accurately than if a loopback were to use the fabric. While only two input/output ports are required to determine the performance of an input/output port, all the input/output circuits in an input/output bank can advantageously be chained together to form a ring oscillator (RO), where one of the input/output circuits in the chain may be configured as an inverter instead of a buffer to start the oscillation. The oscillating frequency of the RO is dependent of the input/output receiver and transmitter buffer delay. Because the ring oscillator is formed by the input/output circuits, the ring oscillator frequency advantageously represents the true performance of input/output circuit and can be used to monitor the input/output transistor process corners. The loopback connections between the adjacent IOs are preferably optimized to minimize the distortion to the signal, and buffered if wire load is significant.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Figure 1:
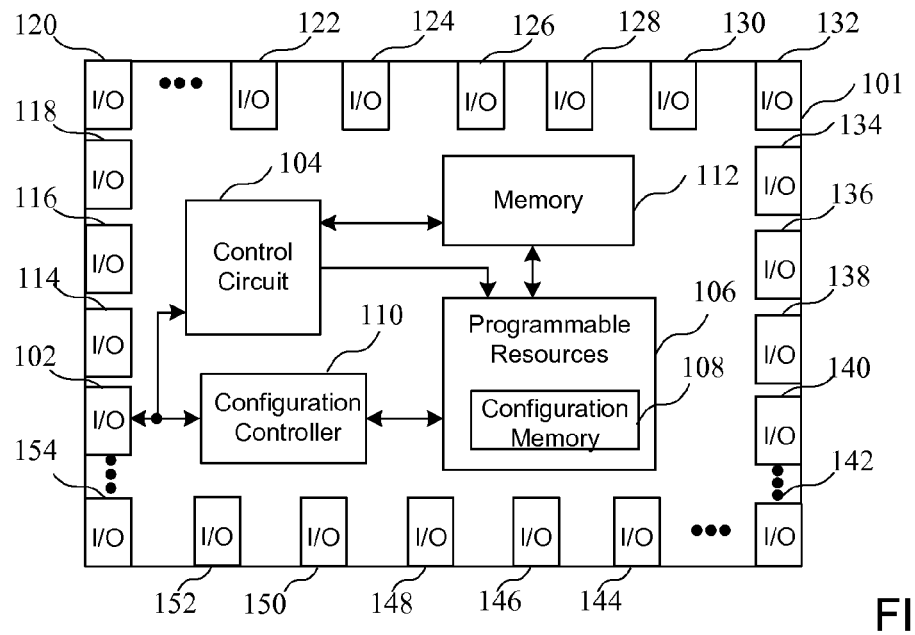
FIG. 1 is a block diagram of an integrated circuit device having a plurality of input/output ports.

Turning first to FIG. 1, a block diagram of an integrated circuit device having a plurality of input/output ports is shown. In particular, an input/output port 102 is coupled to a control circuit 104 which controls programmable resources 206 having configuration memory 208. Configuration data, which will be described in more detail below in reference to FIGS. 7-9, may be provided to the configuration memory 208 by a configuration controller 210. A separate memory 212, which may be a non-volatile memory for example, may be coupled to the control circuit 204 and the programmable resources 206. Additional input/output circuits 114-154, shown around the circumference of the integrated circuit, are configured to enable the testing of an input/output block, as will be described in more detail below. While the input/output circuits 114-154 are shown by way of example around the perimeter, it should be understood that the circuits and methods for testing an input/output circuit could be implemented with input/output circuits positioned in any location.

Figure 2:
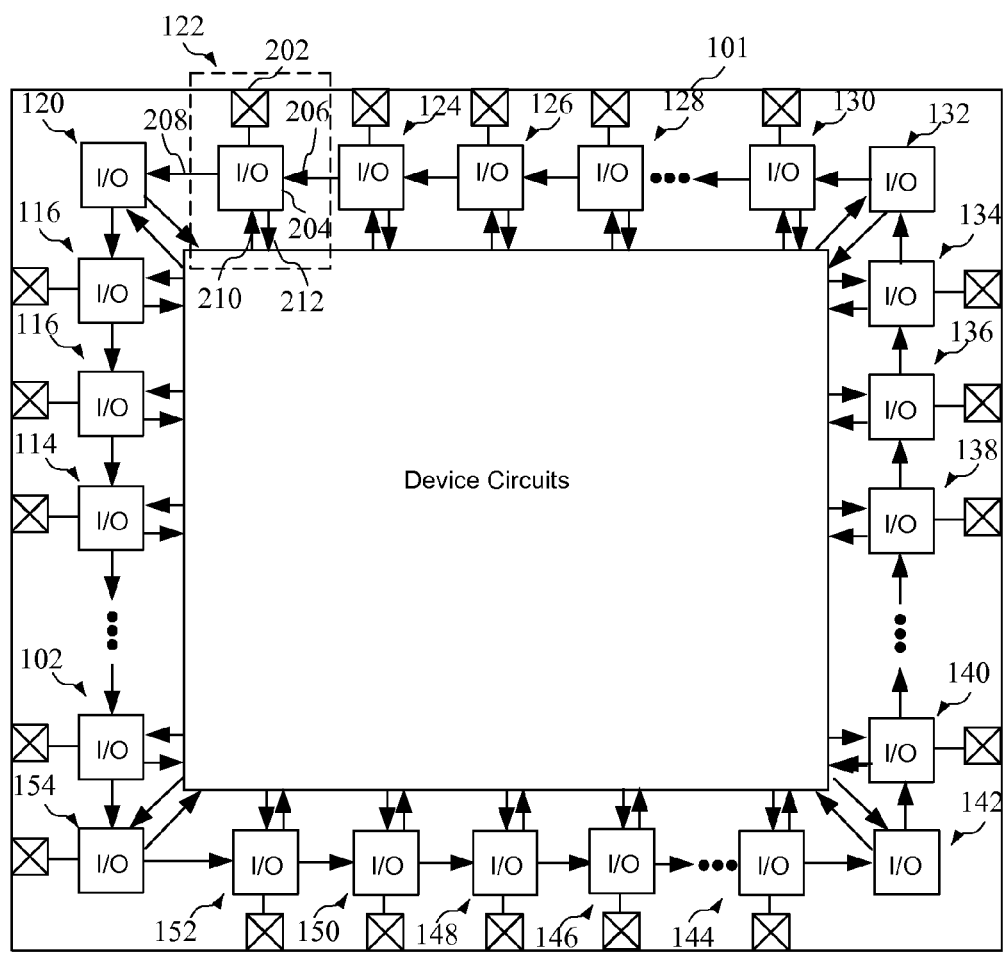
FIG. 2 is a block diagram of an integrated circuit device showing details of input/output ports.
Figure 3:
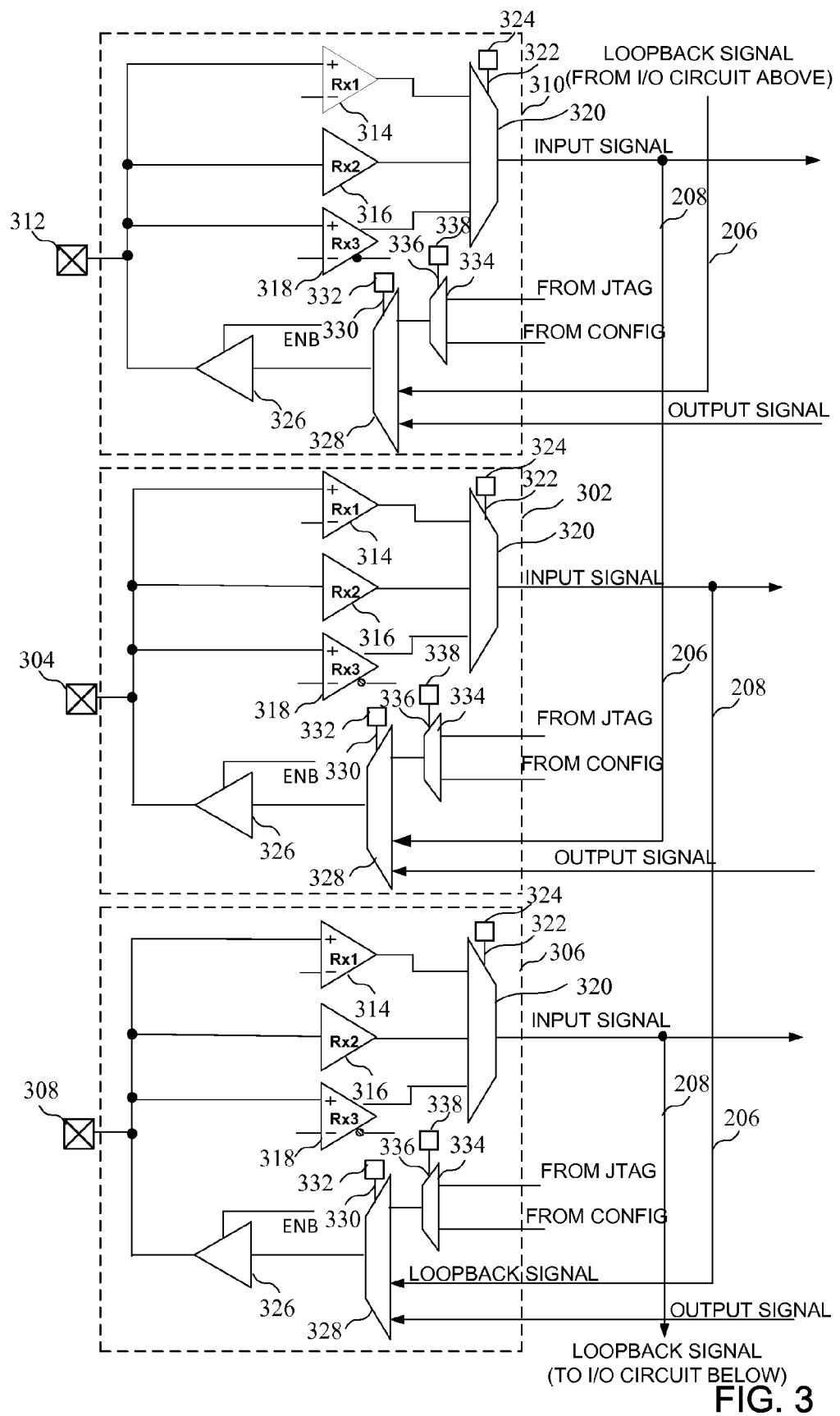
FIG. 3 is a block diagram showing three input/output ports coupled to enable the testing of an input/output port.

Turning now to FIGS. 2 and 3, diagrams showing details of input/output ports provide more details related to the connection of the input/output ports so that the performance of an input/output port can be tested. The connections between the input/output ports are shown for each input/output port, where the labeled input/output port 122 shows an input/output pad 202, and input/output circuit 204 coupled to a test signal input 206 and a test signal output 208 (where a test signal output of one circuit is a test signal input of another circuit as will be shown in more detail in FIG. 3). An output signal line 210 and an input signal line 212 enable the transfer of data between the input/output port and other circuits of the integrated circuit device, shown generally in FIG. 2 as device circuits. As will be described in more detail in reference to FIG. 3, a test signal at the input/output pad 202 is coupled to the input signal line 212, which can be routed by the input/output circuit 204 to another input/output port 120 by way of the test signal output 208.

Turning now to FIG. 3, a block diagram shows three input/output ports coupled to enable the testing of an input/output port. Three input/output ports are provided in FIG. 3 for showing how one of the input/output ports receives/generates all of the necessary signals for testing that input/output port. However, it should be understood that any number of input/output ports could be implemented, where each of the input/output ports could be tested. As will be further described in more detail in reference to FIG. 4, the input/output ports can be connected in a ring to form a ring oscillator to test the operation of the input/output ports.

As shown in FIG. 3, a first input/output port 302 is coupled to an input/output pad 304. The first input/output port 302 is coupled to a second input/output port 306 having an input/output pad 308 below the input/output port 302, and to a third input/output port 310 having an input/output pad 312 above the input/output port 302. Each of the input/output ports comprises circuits for routing test signals received at an input/output pad to another input/output port, and particularly the input/output pad of the other input/output port. Each of the input/output ports is configured with the same circuits, where the input/output port 302 is described by way of example. However, each of input/output ports will be referenced in describing the operation of the input/output ports. The input/output port 304 comprises a plurality of receivers 314-316 coupled to a selection circuit 320, shown here by way of example as a multiplexer having a control terminal 322 coupled to a control signal 324 which may be changed by a partial of full reconfiguration of the integrated circuit device. The control signal may be a configuration memory element, as will be described in more detail below. Each of the receivers may be different types of receivers, where the input/output ports are implemented according to different interface standards, such as double data rate (DDR3/4) or low-voltage differential signaling (LVDS) interface standard. While multiple receivers are shown, it should be understood that a single receiver could be implemented.

The output of the selection circuit is an input signal which is provided to circuits of the integrated circuit. A transmitter circuit 326 is also coupled to the input/output pad 304, and coupled to receive one of a plurality of signals which will be generated as at the input/output pad 304. In addition to an output signal from the circuits of the integrated circuit, a multiplexer 328, which has a control terminal 330 receiving a control signal 332 that may also be data stored in a configuration memory element, may also receive the input signal of another input/output port by way of a test signal input 206. The test signal may be considered a loopback signal from another input/output port. The selection circuit 328 may also receive other signals by way of another selection circuit 334 having a control terminal 336 which is controllable by another selection signal 338, such as a signal from a JTAG or configuration circuit for example.

During a testing operation, a test signal coupled to an input/output pad 312 associated with the input/output port 310 is detected at the input/output pad 304 of input/output port 302 to test the operation of input/output ports. In a test mode of operation, the selection circuit 328 of the input/output port 302 is configured to route the test signal from the input/output pad 312 to the input/output pad 304. In particular, rather than selecting the output signal to be routed to the input/output pad as during normal operation, the selection circuit 328 is configured to select the input signal generated at the output of the selection circuit 320 (which is the test signal) on the test signal input 206. During normal operation, the selection circuit 328 is configured to select the output signal, or some other desired signal. Accordingly, as can be seen, two input/output ports are required to test operating characteristics, such as speed and particularly the speed of transistors, associated with a receiver of one input/output port and a transmitter of another input/output port, in response to configuring a selection circuit of one of the input/output ports. While input/output ports 302 and 310 were described by way of example, input/output port 306 could be configured to test the input/output ports 302 and 306. Accordingly, pairs of input/output ports can be configured to test all of the input/output ports.

Figure 4:
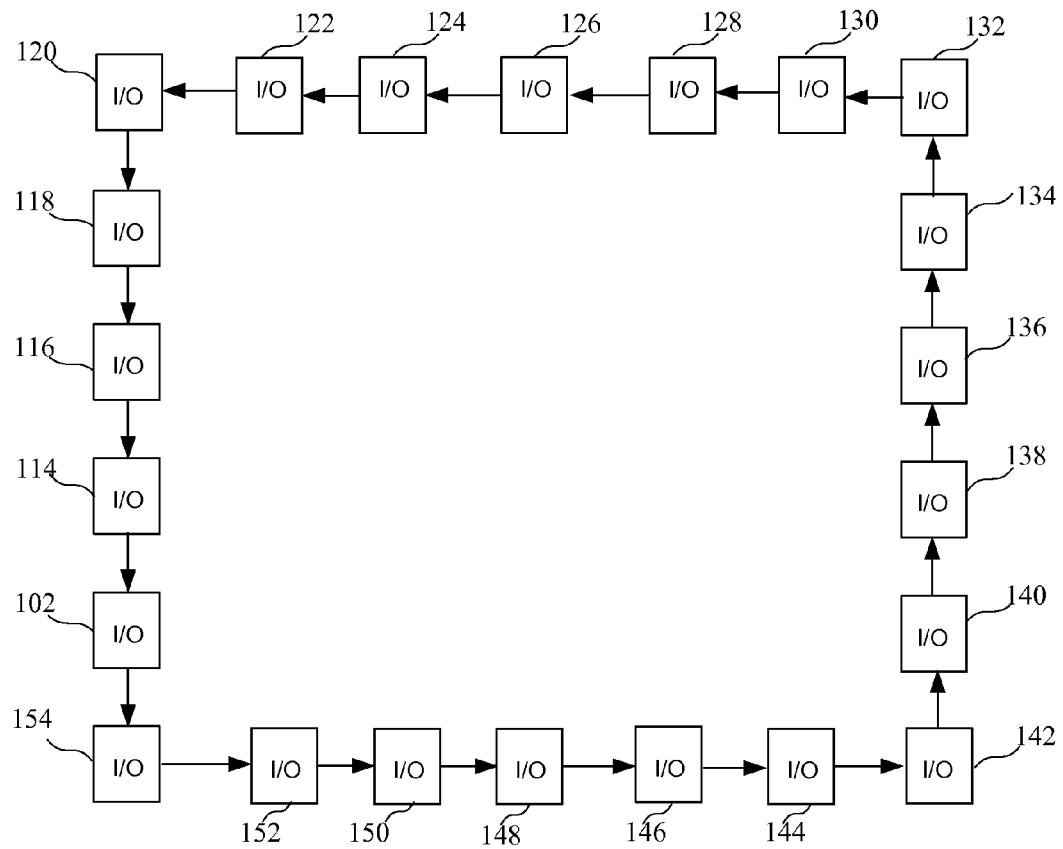
FIG. 4 is a block diagram of a plurality of input/output ports configured in a ring to enable testing of an input/output port.

Further, as shown in the arrangement of FIG. 4, a plurality of input/output ports can configured in a ring to enable testing of an input/output port by establishing a ring oscillator. That is, an output of each input/output port is coupled to an input of another input/output port to form a ring, where the output of one of the input/output ports is inverted to start the oscillation, where the speed of the transistors associated with the input/output ports can be determined from the operating frequency of the signal in the ring oscillator. Preferably, an inverter would be implemented in one of the input/output ports. Accordingly, the circuit advantageously enables the determination of the operating characteristics of circuits of the input/output ports without the use of circuits which are external to the input/output ports. When the plurality of input/output ports are configured as a ring-oscillator, the response of the ring oscillator can be observed during a test at any one of the input/output pads associated with the plurality of input/output ports or inside the fabric at any one or more of the input signals. By providing a selection circuit which receives a loopback signal from an input of another input/output port, the circuits can more accurately determine operating characteristics of the input/output ports. Accordingly, the circuit comprises a plurality of input/output ports can be configured to extend from a first input/output port to a last input/output port, wherein a test output of each input/output port is coupled to a test signal input of a next input/output port, and test signal output of a last input/output port is coupled to a test signal input of the first input/output port. While the implementation of FIG. 4 shows all of the input/output ports implemented as a part of a ring oscillator, it should be understood that a subset of the input/output ports can be configured as a ring oscillator.

Figure 5:
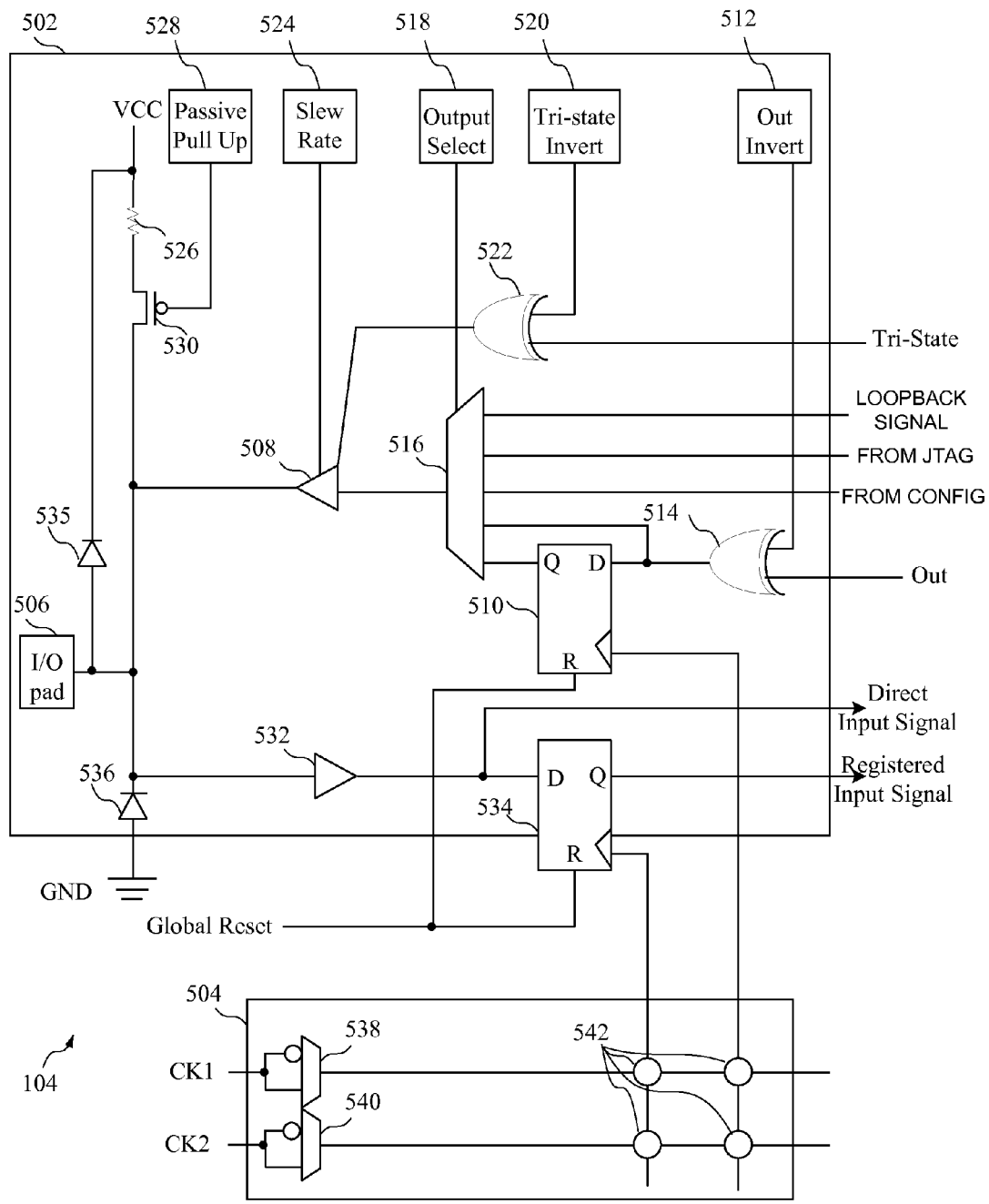
FIG. 5 is a block diagram of a configurable input/output port which may be implemented in a circuit enabling the testing of an input/output port.

Turning now to FIG. 5, a block diagram of a configurable input/output port which may be implemented in a circuit enabling the testing of an input/output port is shown. The I/O port includes an I/O portion 502 and a clock control portion 504. The I/O portion 502 includes an I/O pad 506 for receiving an input signal or providing an output signal. The I/O port also includes a tri-state output driver 508 that may be driven directly or by a register 510. The polarities of both the output data and the tri-state control signal may be determined by configuration bits. In particular, an output data bit (Out) and an output invert control bit 512 are coupled to an exclusive OR (XOR) gate 514. The output of the XOR gate is coupled to the input of the register 510 or directly to a multiplexer 516. An output select control bit 518 is coupled to control the multiplexer 516 to enable the multiplexer to select either the output of the register 510 or the output of the XOR gate 514. The output may also be tri-stated. In order to enable the tri-stating of the output driver 508, a tri-state signal and a tri-state invert bit 520 are coupled to an XOR gate 522, the output of which controls the output driver 508. Each output buffer may also be configured to have either a fast or a slow slew rate according to a slew rate bit 524.

Additionally, the I/O portion 504 may be configured as a latch. When an I/O port is used exclusively as an input, an optional pull-up resistor 526 may be selected by way of a passive pull-up bit 528 and coupled to the gate of a transistor 530. The resistor 526 is decoupled when the I/O block is configured as an output or as a bidirectional I/O block. The I/O pad 506 is also coupled to an input driver 532, the output of which is coupled to a register 534. Accordingly, a direct input signal or a registered input signal may be generated. The values of output invert control bit 512, output select control bit 518, tri-state invert bit 520, slew rate bit 524, and passive pull up bit 528 may be stored in configuration memory elements which are set by configuration bits of a configuration bitstream. A first protection diode 535 extends between the input/output pad 506 and the reference potential (VCC) and a second protection diode 536 extends between the input/output pad 506 and ground (GND), as shown.

The clock control portion 504 includes a first multiplexer 538 coupled to receive a first clock (CK1) and an inverted first clock, and a second multiplexer 540 coupled to receive a second clock (CK2) and a inverted second clock. Programmable interconnect points 542 enable routing a desired clock signal of the various clock signals to the registers 510 and 534. While the circuit of FIG. 5 shows one example of an I/O port which may be implemented, it should be understood that other I/O ports or variations of the I/O port of FIG. 5 may be implemented.

Figure 6:
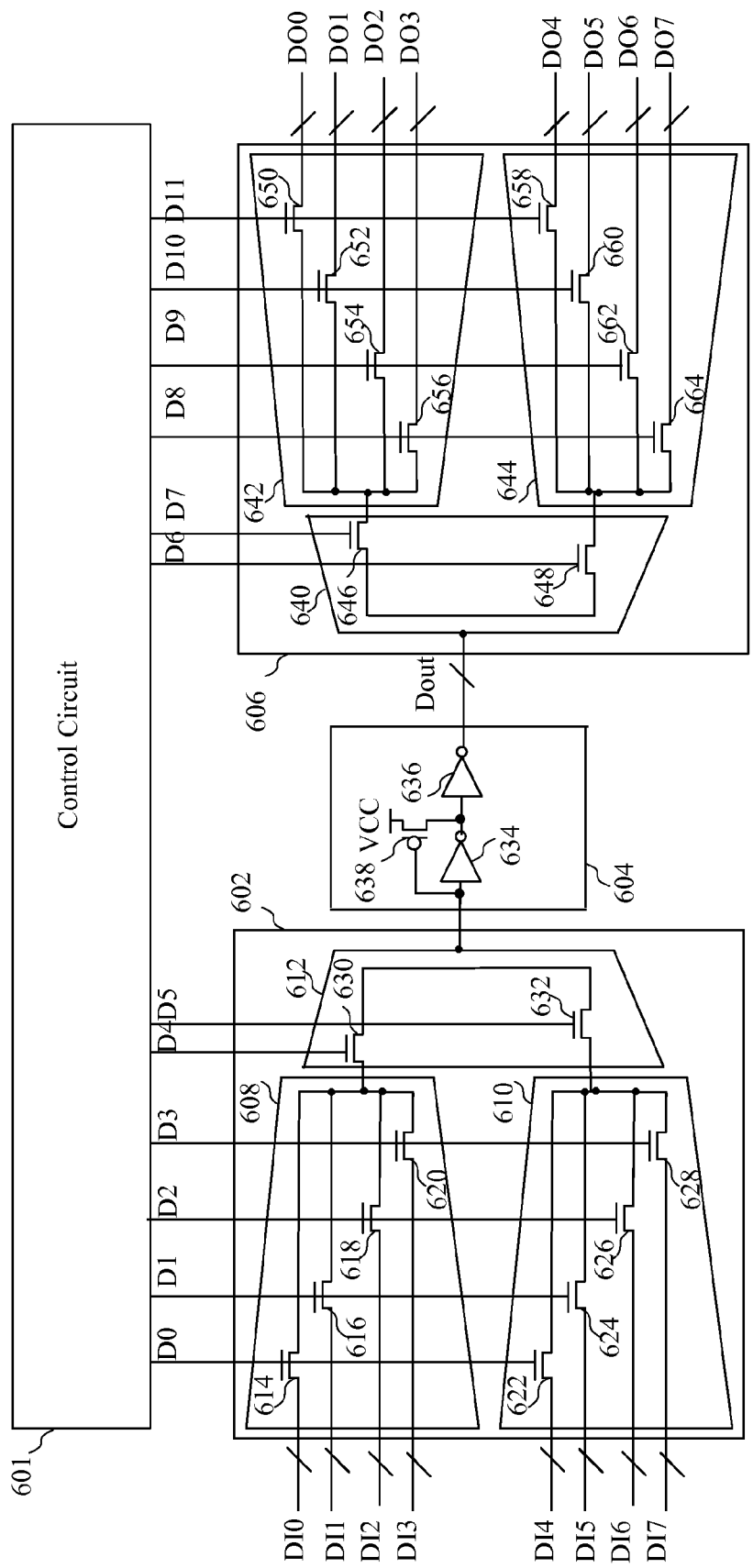
FIG. 6 is a block diagram of a routing circuit enabling the routing of signals from an input/output port to circuits of an integrated circuit device.

Turning now to FIG. 6, a block diagram of a routing circuit enabling the routing of signals from an input/output port to circuits of an integrated circuit device is shown. The interface circuit comprises a routing matrix which is programmable to enable the coupling of various inputs, designated by DIx, to various outputs, designated by DOx. In particular, the interface circuit 601 may comprise a multiplexer circuit 602, a buffer circuit 604, and demultiplexer 606.

The multiplexing circuit 602 comprises stages of multiplexers including multiplexers 608 and 610 in a first stage and a multiplexer 612 in a second stage. The multiplexer circuit 602 as shown receives 8 digital input signals DI0-DI7 which may be selected to be coupled to output buffer 604. The multiplexer 608 comprises a transistor 614 having a gate for receiving the input DI0, a transistor 616 having a gate for receiving the input DI1, a transistor 618 having a gate for receiving the input DI2, and a transistor 620 having a gate for receiving the input DI3. Similarly, the multiplexer 610 comprises a transistor 622 having a gate for receiving the input DI4, a transistor 624 having a gate for receiving the input DI5, a transistor 626 having a gate for receiving the input DI6, and a transistor 628 having a gate for receiving the input DI7. The multiplexer 612 comprises a first transistor 630 enabling routing the output of the multiplexer 608 and a second transistor 632 enabling routing the output of the multiplexer 610.

The output buffer 604 comprises and inverter 634 and an inverter 636. A transistor 638 is coupled at its gate to the output of the inverter 634 and its source to the output of the inverter 636. The output buffer circuit 604 receives a selected input to the multiplexing circuit 602, and generates an output which is coupled to the demultiplexer circuit 606.

The demultiplexer 606 comprises stages of de-multiplexers including demultiplexer 640 in a first stage and demultiplexers 642 and 644 in a second stage. The demultiplexer circuit 640 receives the output of the buffer circuit 604 at its input and generates an output using transistors 646 and 648. The multiplexer 642 comprises a transistor 650 for generating the output DO0, a transistor 652 for generating the output DO1, a transistor 654 for generating the output DO2, and a transistor 658 for generating the output DO3. Similarly, the multiplexer 644 comprises a transistor 658 for generating the output DO4, a transistor 660 for generating the output DO5, a transistor 662 for generating the output DO6, and a transistor 664 for generating the output DO7. The control circuit 634 also generates the appropriate control signals D0-D11 to couple the appropriate input data to the appropriate data outputs. The control circuit 601 may comprise memory elements for storing configuration data, for example. Accordingly, when configuring an integrated circuit, the interconnect circuits would provide the desired connects between various signals, such as between the input/output ports and other circuitry of the integrated circuit.

Figure 7:
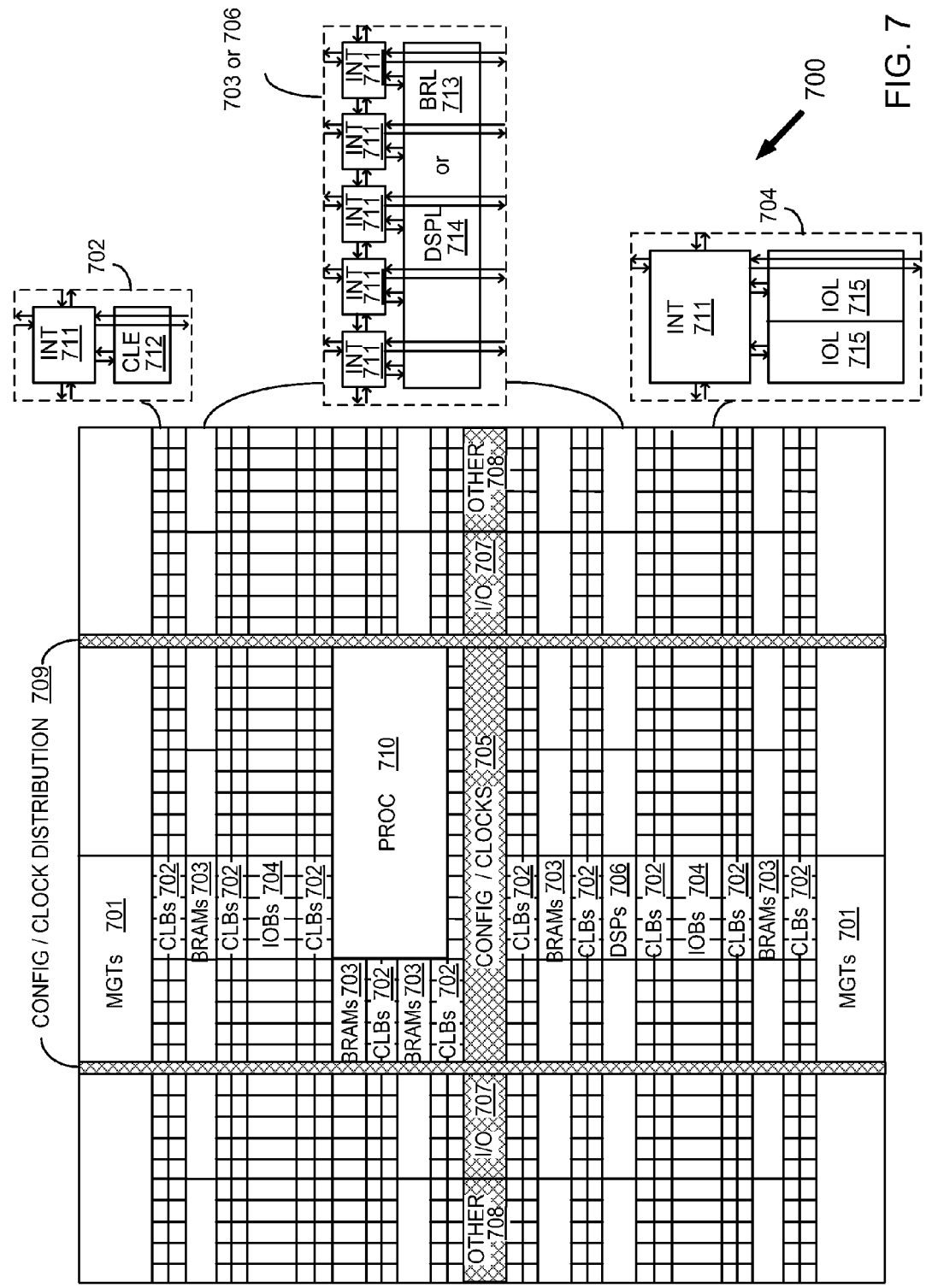
FIG. 7 is a block diagram of an integrated circuit having programmable resources.

Turning now to FIG. 7, a block diagram of an integrated circuit having programmable resources is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 7 comprises an FPGA architecture 7900 having a large number of different programmable tiles including multi-gigabit transceivers (MGTs) 701, CLBs 702, random access memory blocks (BRAMs) 703, input/output blocks (IOBs) 704, configuration and clocking logic (CONFIG/CLOCKS) 705, digital signal processing blocks (DSPs) 706, specialized input/output blocks (I/O) 707 (e.g., configuration ports and clock ports), and other programmable logic 708 such as digital clock managers, analog-to-digital converters, system monitoring logic, and so forth. Some FPGAs also include dedicated processor blocks (PROC) 710, which may be used to implement a software application, for example.

In some FPGAs, each programmable tile includes a programmable interconnect element (INT) 711 having standardized connections to and from a corresponding interconnect element in each adjacent tile. Therefore, the programmable interconnect elements taken together implement the programmable interconnect structure for the illustrated FPGA. The programmable interconnect element 711 also includes the connections to and from the programmable logic element within the same tile, as shown by the examples included at the top of FIG. 7.

For example, a CLB 702 may include a configurable logic element (CLE) 712 that may be programmed to implement user logic plus a single programmable interconnect element 711. A BRAM 703 may include a BRAM logic element (BRL) 713 in addition to one or more programmable interconnect elements. The BRAM includes dedicated memory separate from the distributed RAM of a configuration logic block. Typically, the number of interconnect elements included in a tile depends on the height of the tile. In the pictured implementation, a BRAM tile has the same height as five CLBs, but other numbers may also be used. A DSP tile 706 may include a DSP logic element (DSPL) 714 in addition to an appropriate number of programmable interconnect elements. An IOB 704 may include, for example, two instances of an input/output logic element (IOL) 715 in addition to one instance of the programmable interconnect element 711. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured implementation, a columnar area near the center of the die is used for configuration, clock, and other control logic. The config/clock distribution regions 709 extending from this column are used to distribute the clocks and configuration signals across the breadth of the FPGA. Some FPGAs utilizing the architecture illustrated in FIG. 7 include additional logic blocks that disrupt the regular columnar structure making up a large part of the FPGA. The additional logic blocks may be programmable blocks and/or dedicated logic. For example, the processor block PROC 710 shown in FIG. 7 spans several columns of CLBs and BRAMs.

Note that FIG. 7 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 7 are purely exemplary. For example, in an actual FPGA more than one adjacent column of CLBs is typically included wherever the CLBs appear in order to facilitate the efficient implementation of user logic. While the implementation of FIG. 7 relates to an integrated circuit having programmable resources, it should be understood that the circuits and methods for enabling the testing of input/output pads.

Figure 8:
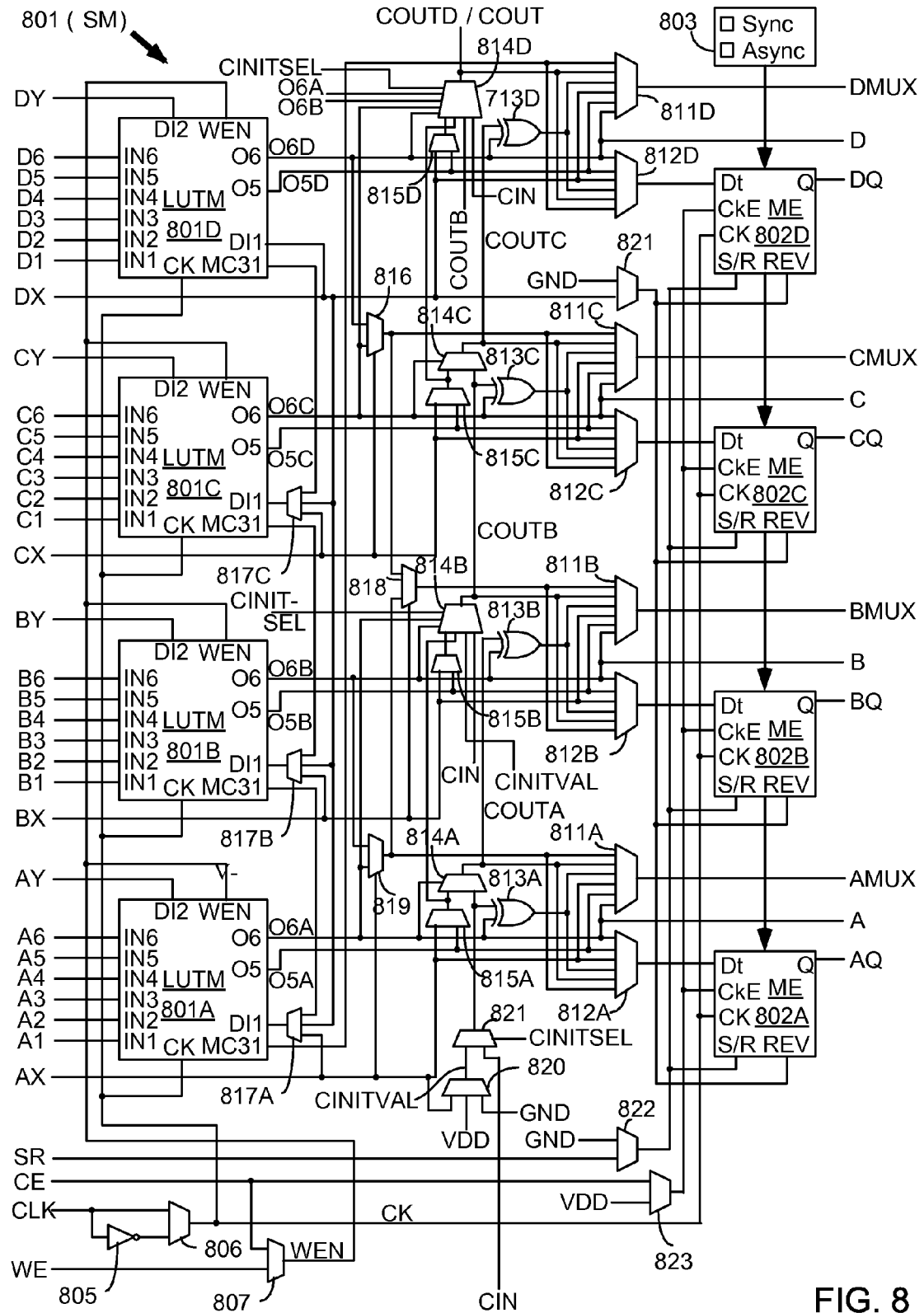
FIG. 8 is a block diagram of a configurable logic element of the integrated circuit of FIG. 7.

Turning now to FIG. 8, a block diagram of a configurable logic element is shown. In particular, FIG. 8 illustrates in simplified form a configurable logic element of a configuration logic block 702 of FIG. 7. In the implementation of FIG. 8, slice M 801 includes four lookup tables (LUTMs) 801A-1001D, each driven by six LUT data input terminals A1-A6, B1-B6, C1-C6, and D1-D6 and each providing two LUT output signals O5 and O6. The O6 output terminals from LUTs 801A-801D drive slice output terminals A-D, respectively. The LUT data input signals are supplied by the FPGA interconnect structure via input multiplexers, which may be implemented by programmable interconnect element 1011, and the LUT output signals are also supplied to the interconnect structure. Slice M also includes: output select multiplexers 811A-811D driving output terminals AMUX-DMUX; multiplexers 812A-812D driving the data input terminals of memory elements 802A-802D; combinational multiplexers 816, 818, and 819; bounce multiplexer circuits 822-823; a circuit represented by inverter 805 and multiplexer 806 (which together provide an optional inversion on the input clock path); and carry logic having multiplexers 814A-814D, 815A-815D, 820-821 and exclusive OR gates 813A-813D. All of these elements are coupled together as shown in FIG. 8. Where select inputs are not shown for the multiplexers illustrated in FIG. 8, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 8 for clarity, as well as from other selected figures herein.

In the pictured implementation, each memory element 802A-802D may be programmed to function as a synchronous or asynchronous flip-flop or latch. The selection between synchronous and asynchronous functionality is made for all four memory elements in a slice by programming Sync/Asynch selection circuit 803. When a memory element is programmed so that the S/R (set/reset) input signal provides a set function, the REV input terminal provides the reset function. When the memory element is programmed so that the S/R input signal provides a reset function, the REV input terminal provides the set function. Memory elements 802A-802D are clocked by a clock signal CK, which may be provided by a global clock network or by the interconnect structure, for example. Such programmable memory elements are well known in the art of FPGA design. Each memory element 802A-802D provides a registered output signal AQ-DQ to the interconnect structure. Because each LUT 801A-801D provides two output signals, O5 and O6, the LUT may be configured to function as two 5-input LUTs with five shared input signals (IN1-IN5), or as one 6-input LUT having input signals IN1-IN6.

In the implementation of FIG. 8, each LUTM 801A-801D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 817A-817C for LUTs 801A-801C), or to the two 32-bit RAMs via input terminals DI1 and DI2. RAM write operations in the LUT RAMs are controlled by clock signal CK from multiplexer 1006 and by write enable signal WEN from multiplexer 807, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 801A may also be provided to the general interconnect structure for shift register chaining, via output select multiplexer 811D and CLE output terminal DMUX. Accordingly, the circuits and methods set forth above may be implemented in a device such as the devices of FIGS. 7 and 8, or any other suitable device.

Figure 9:
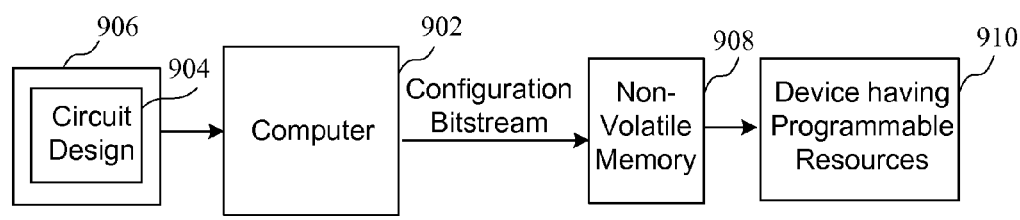
FIG. 9 is a block diagram of system for programming the integrated circuit device of FIG. 7.

Turning now to FIG. 9, a block diagram of system for programming the integrated circuit device of FIG. 7 is shown. In particular, a computer 902 is coupled to receive a circuit design 904 from a memory 906, and generates a configuration bitstream which is stored in the non-volatile memory 906. As will be described in more detail below, the circuit design may be a high level design, such as a circuit design defined in a hardware description language (HDL). Also, the computer may be configured to run software that generates a configuration bitstream which is stored in the non-volatile memory 908 and provided to an integrated circuit 910 which may be a programmable integrated circuit, such as the integrated circuit described above in FIG. 7. As will be described above, bit of the configuration bitstream are used to configure programmable resources of the integrated circuit.

Figure 10:
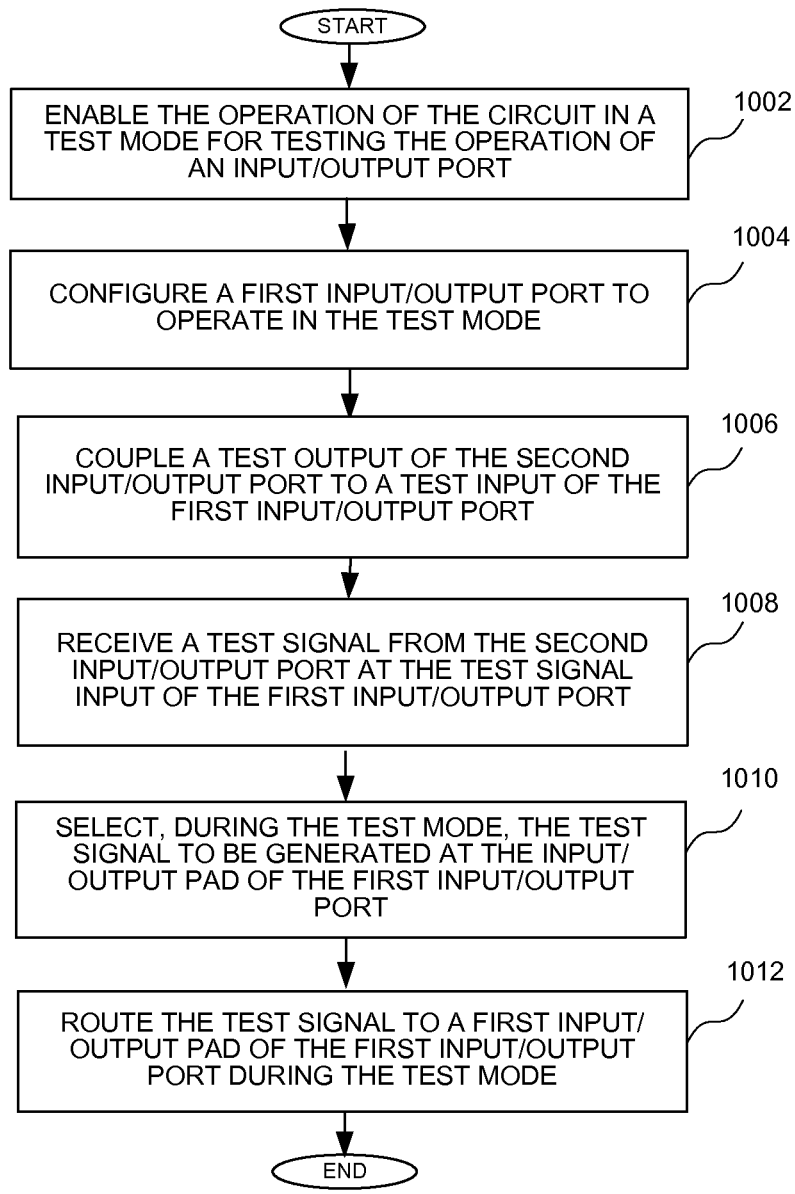
FIG. 10 is a flow chart showing a method of testing the operation of an input/output circuit.

Turning now to FIG. 10, a flow chart shows a method of testing the operation of an input/output circuit. In particular, the operation of the circuit in a test mode is enabled for testing the operation of an input/output port at a block 1002. A first input/output port is configured to operate in the test mode at a block 1004. A test signal output of the second input/output port is coupled to a test signal input of the first input/output port at a block 1006. A test signal from the second input/output port is received at the test signal input of the first input/output port at a block 1008. The test signal is selected, during the test mode, to be generated at the input/output pad of the first input/output port at a block 1010. The test signal is routed to a first input/output pad of the first input/output port during the test mode at a block 1012.

Figure 11:
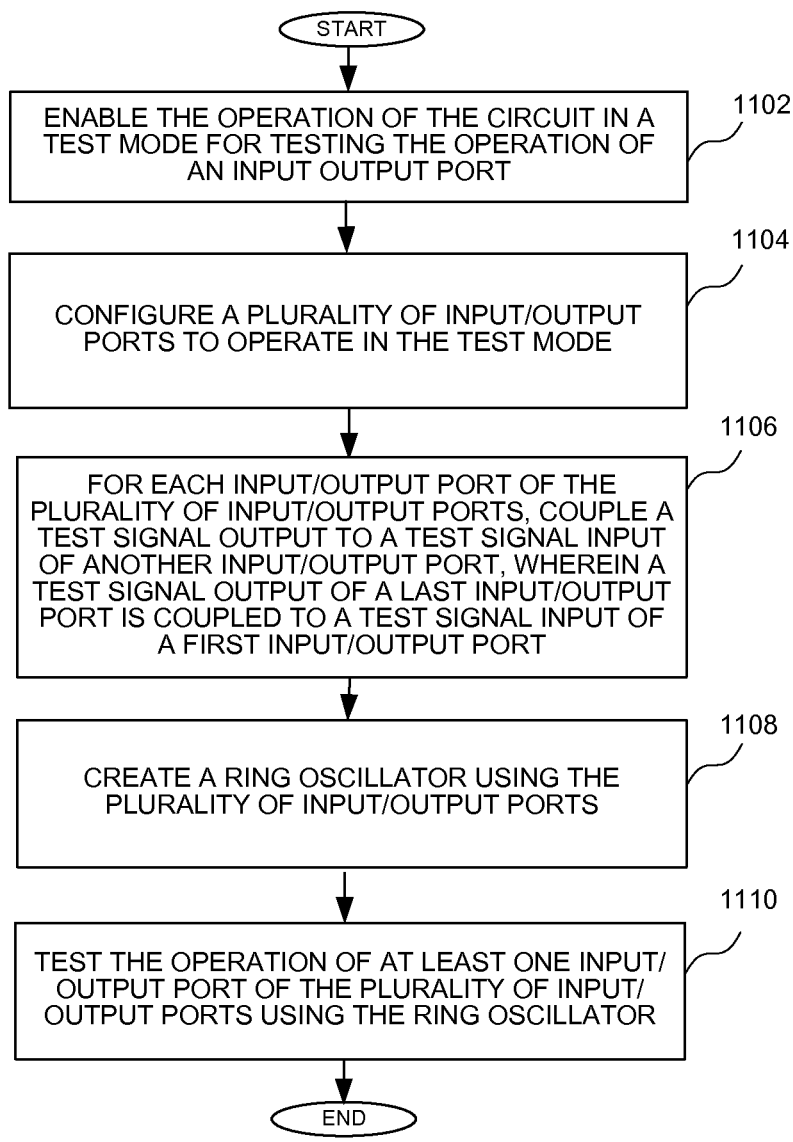
FIG. 11 is a flow chart showing another method of testing the operation of an input/output circuit.

Turning now to FIG. 11, a flow chart shows another method of testing the operation of an input/output circuit of an integrated circuit device. The operation of the circuit is enabled in a test mode for testing the operation of an input output port at a block 1102. A plurality of input/output ports is configured to operate in the test mode at a block 1104. A test output for each input/output port of the plurality of input/output ports is coupled to a test signal input of another input/output port, wherein a test signal output of a last input/output port is coupled to a test signal input of a first input/output port at a block 1106. A ring oscillator is created using the plurality of input/output ports at a block 1108. It should be noted that a subset of the input/output ports of the integrated circuit device can be used to implement a ring oscillator. The operation of at least one input/output port of the plurality of input/output ports is tested using the ring oscillator at a block 1110.

The various elements of the methods of FIGS. 10 and 11 may be implemented using the circuits of FIGS. 1-9 as described, or using some other suitable circuits. While specific elements of the method are described, it should be understood that additional elements of the methods, or additional details related to the elements, could be implemented according to the disclosure of FIGS. 1-9.

It can therefore be appreciated that the new and novel circuits and methods of testing the operation of an input/output port has been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A circuit for testing the operation of an input/output port of an integrated circuit device, the circuit comprising:
    a first input/output port having a first input/output pad configured to receive a test signal, a test signal output, and an input signal line enabling the transfer of data between the first input/output port and other circuits of the integrated circuit device; and
    a second input/output port having a second input/output pad and a selection circuit configured to receive the test signal and an output signal, the selection circuit enabling routing the test signal received by way of the first input/output pad and the test signal output of the first input/output port to the second input/output pad.

2. The circuit of claim 1 wherein a test signal input of the second input/output port is coupled to the test signal output of the first input/output port, and the test signal is routed from the test signal output of the first input/output port to the test signal input of the second input/output port.

3. The circuit of claim 2 wherein a test signal input of the first input/output port is coupled to the test signal output of a third input/output port, wherein the test signal is received at the first input/output pad of the first input/output port by way of the test signal input of the first input/output port.

4. The circuit of claim 2 wherein the selection circuit is configured to select one of the test signal or an output signal to be generated at the second input/output pad.

5. The circuit of claim 1 wherein the first input/output port comprises a plurality of receivers and a second selection circuit, wherein the second selection circuit is configured to select an output of one of the receivers of the plurality of receivers for the test signal output of the first input/output port.

6. The circuit of claim 1 wherein a control terminal of the selection circuit is coupled to receive a control signal enabling the operation of the circuit in a test mode for routing the test signal from the first input/output pad to the second input/output pad.

7. The circuit of claim 1 wherein the circuit comprises a plurality of input/output ports extending from the first input/output port to a last input/output port, wherein a test signal output of each input/output port is coupled to a test signal input of a next input/output port, and a test signal output of the last input/output port is coupled to a test signal input of the first input/output port.

8. A circuit for testing the operation of an input/output port of an integrated circuit device, the circuit comprising:
   a plurality of input/output ports, each input/output port having a test signal input, a test signal output, and a selection circuit, wherein the selection circuit of each input/output port enables coupling a test signal to the test signal input of another input/output port by way of the test signal output; and
   a control circuit coupled to control the plurality of input/output ports to operate in a test mode or an operational mode, wherein the circuit is configured to route the test signal from an input/output pad of a first input/output port of the plurality of input/output ports to an input/output pad of a second input/output port of the plurality of input/output ports by way of a test signal output of the first input/output port to a test signal input of the second input/output port.

9. The circuit of claim 8 wherein a test signal input of the first input/output port is coupled to the test output of a third input/output port, wherein the test signal is received at the input/output pad of the first input/output port by way of the test signal input of the first input/output port.

10. The circuit of claim 8 wherein the selection circuit selects one of the test signal or an output signal to be generated at the input/output pad of the second input/output port.

11. The circuit of claim 8 wherein each input/output port comprises a plurality of receivers and a second selection circuit enabling the selection of an output of one of the receivers of the plurality of receivers.

12. The circuit of claim 11 wherein a control terminal of the selection circuit is coupled to receive a control input enabling the operation of the input/output port in a test mode for routing the test signal from the first input/output pad to the second input/output pad.

13. The circuit of claim 8 wherein the plurality of input/output ports are configured as a ring-oscillator, and the response of the ring oscillator can be observed during a test at any one of the input/output pads associated with the plurality of input/output ports.

14. A method of testing the operation of an input/output port of an integrated circuit device, the method comprising:
   configuring a first input/output port having a first input/output pad to operate in a test mode;
   receiving a test signal at a second input/output pad of a second input/output port;
   receiving the test signal from the second input/output port at a test signal input of the first input/output port, the second input/output port having an input signal line enabling the transfer of data between the second input/output port and other circuits of the integrated circuit device;
   enabling a selection of the test signal or an output signal; and
   routing the selected signal to the first input/output pad of the first input/output port.

15. The method of claim 14 further comprising coupling a test signal output of the second input/output port to a test signal input of the first input/output port, and routing the test signal from the test signal output of the second input/output port to the test signal input of the first input/output port.

16. The method of claim 15 further comprising coupling a test signal input of the second input/output port to the test signal output of a third input/output port, wherein the test signal is received at the second input/output pad of the second input/output port by way of the test signal input of the second input/output port.

17. The method of claim 15 further comprising selecting one of the test signal or the output signal to be generated at the first input/output pad of the first input/output port.

18. The method of claim 14 wherein the first input/output port comprises a plurality of receivers, the method further comprising selecting an output of one of the receivers of the plurality of receivers for inputting to the input signal line.

19. The method of claim 14 further comprising enabling the operation of the integrated circuit device in the test mode for routing the test signal from the second input/output pad to the first input/output pad.

* * * * *